(12) United States Patent
Adachi (10) Patent No.: US 7,331,780 B2
(45) Date of Patent: Feb. 19, 2008

(54) HEAT TREATMENT JIG FOR SEMICONDUCTOR WAFER

(75) Inventor: Naoshi Adachi, Tokyo (JP)

(73) Assignee: Sumco Corporation, Tokyo (JP)

( * ) Notice: Subject to any disclaimer, the term of this patent is extended or adjusted under 35 U.S.C. 154(b) by 172 days.

(21) Appl. No.: 11/239,096

(22) Filed: Sep. 30, 2005

(65) Prior Publication Data

US 2006/0078839 A1 Apr. 13, 2006

Related U.S. Application Data

(63) Continuation-in-part of application No. PCT/JP04/03442, filed on Mar. 15, 2004.

(30) Foreign Application Priority Data

Apr. 2, 2003 (JP) ............................. 2003-099709

(51) Int. Cl.
*F27D 5/00* (2006.01)
(52) U.S. Cl. .................... 432/253; 211/41.18
(58) Field of Classification Search ................ 432/253, 432/258; 211/41.18; 219/443.1; 118/724–725
See application file for complete search history.

(56) References Cited

U.S. PATENT DOCUMENTS

| | | | | |
|---|---|---|---|---|
| 4,725,474 A | * | 2/1988 | Stavric | 428/156 |
| 5,242,501 A | * | 9/1993 | McDiarmid | 118/728 |
| 5,761,023 A | * | 6/1998 | Lue et al. | 361/234 |
| 6,001,183 A | * | 12/1999 | Gurary et al. | 118/720 |
| 6,474,987 B1 | * | 11/2002 | Nakai et al. | 432/258 |
| 6,634,882 B2 | * | 10/2003 | Goodman | 432/253 |
| 6,709,267 B1 | * | 3/2004 | Hawkins et al. | 432/258 |
| 6,896,738 B2 | * | 5/2005 | Sumakeris et al. | 118/725 |
| 7,210,925 B2 | * | 5/2007 | Adachi | 432/253 |
| 2004/0040632 A1 | * | 3/2004 | Oosterlaken | 148/527 |

FOREIGN PATENT DOCUMENTS

| | | |
|---|---|---|
| JP | 10-270369 | 10/1998 |
| JP | 10-321543 | 12/1998 |
| JP | 11-003865 | 1/1999 |
| JP | 2003-197722 | 1/2003 |

* cited by examiner

*Primary Examiner*—Gregory Wilson
(74) *Attorney, Agent, or Firm*—Clark & Brody

(57) ABSTRACT

A heat treatment jig by the invention comprising: the diameter of a disk-type structure being 60% or more of that of loaded semiconductor wafers; the thickness being 1.0 mm or more but 10 mm or less; the surface roughness Ra of 0.1 μm or more but 100 μm or less at a contacting surface with the wafers; and the surface planarity being specifically controlled in the concentric direction as well as in the diametrical direction, otherwise in place of above planarity, comprising a controlled maximum height in such a way that the maximum height is obtained by the flatness measurement at the multiple positions and the difference between said maximum height and the hypothetical-average-height-plane thus set is 50 μm or less, can reduce the slip generation due to the close adhesion of the wafers and the jig. Owing to this, even if the wafers having large tare weight should be heat-treated, the slip generation can be effectively prevented, thus enabling the jig to be widely used as the reliable heat treatment jig for semiconductor substrates.

19 Claims, 9 Drawing Sheets

HEAT TREATMENT JIG FOR SEMICONDUCTOR WAFER

CROSS-REFERENCE TO RELATED APPLICATIONS

This application is a continuation-in-part of International Application No. PCT/JP2004/003442 filed Mar. 15, 2004. This PCT application was not in English as published under PCT Article 21(2).

FIELD OF THE INVENTION

The present invention relates to a heat treatment jig for use in a heat treatment boat of a vertical heat treatment furnace, more particularly, to a heat treatment jig for large diameter semiconductor wafers that can suppress the generation of slips as crystal defects during heat treatment at high temperature.

BACKGROUND ART

A semiconductor wafer that is processed in LSI device fabrication process is repeatedly subjected to a high temperature heat treatment in fabrication steps such as oxidation, diffusion and film deposition. In such a heat treatment, if an inhomogeneous temperature distribution should be generated within a wafer surface, the thermal stress is incurred thereby.

Meanwhile, depending on the supporting method, the stress attributable to a wafer weight (hereinafter referred to as tare stress) generates. With regard to a conventional heat treatment boat, said tare stress affects very much in case that the heat treatment is conducted for semiconductor wafers of 300 mm in diameter, thus resulting in making defects-laden products not to be usable.

Both thermal stress and tare stress as above are known to cause crystal defects called slips within semiconductor wafers during heat treatments. The slips end up in an increase of a leakage current in LSI device and/or deterioration of planarity of semiconductor wafers. In order to secure quality as semiconductor wafers, it is important to reduce the tare stress as well as thermal stress in suppressing the generation of slips.

In a heat treatment of semiconductor wafers, a vertical heat treatment furnace can reduce an installation space and is suitable for simultaneously heat treating a large quantity of semiconductor wafers with large diameter, and, accordingly, is adopted in various heat treatments of semiconductor wafers.

Figure 1:
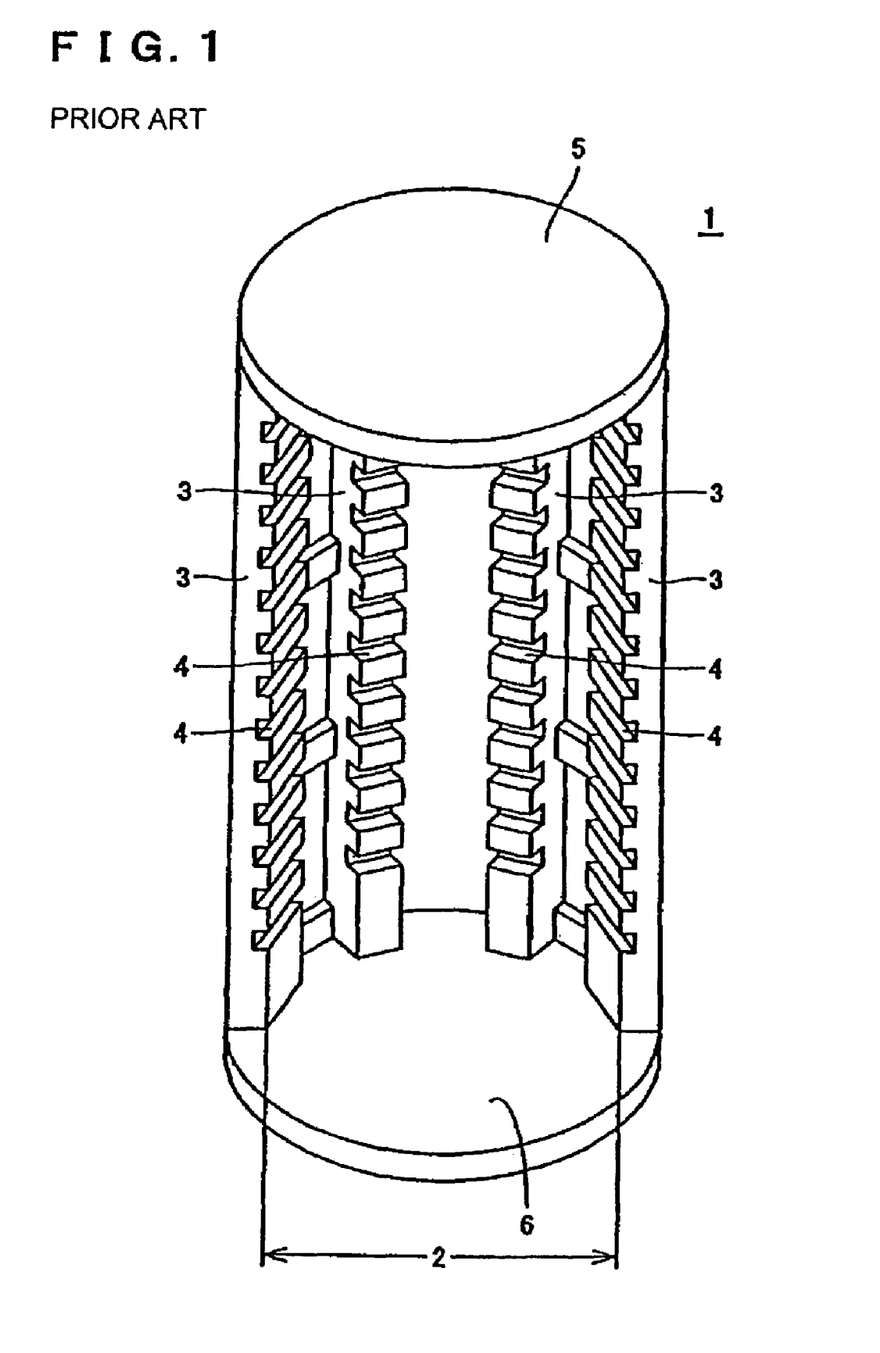
FIG. 1 is a diagram showing a configuration example of a heat treatment boat for silicon semiconductor wafers that is used in a vertical heat treatment furnace.

FIG. 1 is a diagram showing a configuration example of a heat treatment boat for semiconductor wafers for use in a vertical heat treatment furnace. A heat treatment boat 1 comprises three or more pillars 3, top and bottom panels 5, 6 for fixing said pillars 3 at top and bottom positions, and an opening segment 2. The pillars 3 are provided with a wafer support section 4, so that, after the semiconductor wafers are loaded through the opening segment 2 onto the wafer support section 4, the boat is installed into the vertical heat treatment furnace, being followed by predetermined heat treatment.

As shown in FIG. 1, a heat treatment boat 1 is composed of a pair of top and bottom panels 5, 6 disposed with a space and a plurality of pillars 3 that link these top and bottom panels, thus an opening segment 2 is indispensably provided to charge the semiconductor wafers onto the wafer support section 4 or to discharge those therefrom.

Accordingly, two pillars 3 disposed at the opening segment 2, in order to facilitate charging or discharging of semiconductor wafers, are normally put in place with a space equivalent to the diameter of semiconductor wafer.

With regard to a heat treatment for semiconductor wafers with small diameter, a heat treatment boat shown in above FIG. 1 is used where a plural-point-supporting system as much as three- or four-point-support at the peripheral region of wafer backside is widely applied.

Nonetheless, as the diameter of semiconductor wafers increases recently, the incurred tare stress tends to be increased notably, thereby aggravating an inhomogeneous distribution of tare stresses in case of a heat treatment boat shown in above FIG. 1 where a three- or four-point-supporting system is applied at the peripheral region of the wafer backside, and thus resulting in generation of slips markedly.

Accordingly, in order to suppress the generation of slips in association with the increase of diameter of semiconductor wafers, either a jig to support a semiconductor wafer at a plurality of points in the central region of the wafer backside, or a jig structure enabling a semiconductor wafer to make a line or plane contact in a ring-type manner is proposed.

For instance, in Japanese Patent Application Publication No. 10-270369, a wafer supporting jig with a ring-type structure (horse-shoe) having recess portions on its surface, which can be connected to either outward or inward peripheral region, or having a plurality of through-holes is disclosed. According to said supporting jig, it is recognized that an atmosphere gas surrounding an outward peripheral region of said supporting jig is adsorbed during the mobilization of wafers, and the gas is carried to the very contact portion via a plurality of recess portions or through-holes, thereby preventing wafers to adhere to the supporting jig.

Also, in Japanese Patent Application Publication No. 11-3865, a boat for loading wafers is proposed, wherein one pair or plural pairs of beams—a pair of beams being consisted of two beams—is horizontally disposed in the longitudinal direction of the pillars with a predetermined space. By adjusting a space between the two beams, the deflection of wafers is reduced as low as possible, thereby preventing the generation of slips.

Furthermore, in Japanese Patent Application Publication No. 10-321543, a wafer supporting body where a surface roughness is specified is proposed to prevent a silicon wafer from closely adhering to a wafer supporting body (a heat treatment jig) having a disk-type structure or a horse-shoe structure.

Nonetheless, the concerns newly arise in using a heat treatment jig which adopts an improved method of contacting with wafers, such as a proposed supporting jig. Namely, due to the contact of the wafer backside on the supporting jig, the deformation of each component is restricted, whereby the large stress exceeding thermal stress or tare stress will be newly exerted into the semiconductor wafers, thus resulting in generation of slips.

The cause of generating above unexpected slips is considered to be the machining accuracy of the heat treatment jig itself, which particularly hinges on surface planarity and surface roughness on the region where the semiconductor wafer backside contacts with the supporting jig.

However, in case of the supporting jigs and the like which are proposed in Japanese Patent Application Publication Nos. 10-270369, 11-3865 and 10-321543, although there is a description in part regarding surface roughness, there is made neither explanation about its relationship with the slip reduction nor description on surface flatness of the supporting jigs and the like.

Meanwhile, in Japanese Patent Application Publication No. 2003-197722, a ring-type heat treatment jig (including horseshoe-like) is disclosed, wherein surface roughness and flatness are stipulated, and wherein the configuration of said jig is made in such a way that a plurality of through-holes are concentrically disposed over the supporting surface for wafers and a total section area of said through-holes is specified. In above-cited publication, it is taught that preferable surface roughness Ra value and flatness are 0.1-0.7 μm and 50 μm respectively.

In this regard, in considering the heat treatment jig for semiconductor wafers of 300 mm in diameter, high accuracy machining must be applied to secure 50 μm of flatness on whole region to support wafers, thus ending up in the increase of manufacturing cost, which cannot be practical manufacturing parameters in terms of machining accuracy.

SUMMARY OF THE INVENTION

As afore-mentioned, in a jig with the structure to support wafer backside at the central region, being developed in association with the increase of semiconductor wafer diameter, an unexpected cause of slip generation emerges, for which surface roughness and planarity at the contact region are notably responsible.

Further, according to the study by the present inventors, it turns out that, even if said surface roughness and planarity are controlled within predetermined ranges, the surface of said heat treatment jig is not always flat, where surface waviness and convex/concave spots due to surface roughness are present on the surface and slips generates due to the tare stress exerted onto some spots that stand out.

The present invention is made, based on the above study, to solve the problems which the conventional heat treatment jig comes across and its object is to provide a heat treatment jig which can effectively suppress the generation of slips, wherein surface planarity and roughness at the contact region between semiconductor wafer backside and said jig are improved, and wherein the outstanding protruded spots attributable to surface waviness and surface roughness are restricted.

The present inventors have conducted several kinds of heat treatment using a heat treatment boat of a vertical heat treatment furnace, and studied surface planarity, surface roughness, and local concave/convex spots on the jig surface. Consequently, following findings (a) through (d) as below were obtained.

(a) By specifically controlling the thickness of a heat treatment jig, the surface planarity due to the deflection of the heat treatment jig is improved, and the bend of the heat treatment jig due to the tare stress and the strain in association with surface machining can be also prevented.

However, it should be noted that, when the heat treatment jig becomes thicker, the heat capacity thereof gets large, adversely affecting the heat-up/cool-down characteristic, and the number of semiconductor wafers to be charged decreases, thereby reducing the productivity.

(b) By specifying surface planarity of the heat treatment jig and by duly controlling surface roughness, the contact mechanism between semiconductor wafers and the heat treatment jig can be improved, thus enabling the close adhesion of both elements to be prevented.

(c) By incorporating a plurality of protruded portions, the tare stress and thermal stress can be mitigated.

(d) By applying SiC coating onto the surface of the heat treatment jig, even in case an oxygen atmosphere is used in the heat treatment to grow an oxide film on the semiconductor wafer surface, the close adhesion of the grown oxide film onto the surface of the heat treatment jig can be prevented.

The present invention is consummated based on above findings and the gist of a heat treatment jig for semiconductor wafers is described in following (1) through (5).

(1) A heat treatment jig for semiconductor wafers composed of a disk-type structure to be used for heat treatment by loading semiconductor wafers onto the upper surface thereof, said jig comprising: a diameter of said disk-type structure being no less than 60% of the diameter of semiconductor wafers to be treated; a thickness thereof being no less than 1.0 mm but no greater than 10 mm; a surface roughness (Ra value) of the surface to contact with said semiconductor wafers being no less than 0.1 μm but no greater than 100 μm; and a surface planarity thereof being no greater than 0.1 mm in the concentric direction and no greater than 0.2 mm in the diametrical direction (hereinafter referred to as a first heat treatment jig).

(2) A heat treatment jig for semiconductor wafers composed of a disk-type structure to be used for heat treatment by loading semiconductor wafers onto the upper surface thereof, said jig comprising: a diameter of said disk-type structure being no less than 60% of the diameter of semiconductor wafers to be treated; a thickness thereof being no less than 1.0 mm but no greater than 10 mm; and a surface roughness (Ra value) of the surface area to contact with said semiconductor wafers being no less than 0.1 μm but no greater than 100 μm, wherein a contacting surface with said semiconductor wafers is divided into several regions and the maximum height is measured for each region, and wherein a difference between said maximum height and the hypothetical-average-height-plane obtained through above measurement being no greater than 50 μm (hereinafter referred to as a second heat treatment jig).

(3) In a first and second heat treatment jig shown above, it is preferable that the diameter of the surface thereof to contact with semiconductor wafers is specified to be no less than 60% of the diameter of said semiconductor wafers. Further, it is preferable that the surface to contact with said semiconductor wafers is composed of a ring-type structure and the diameter thereof is specified to be no less than 60% of the diameter of semiconductor wafers.

This is for the reason that, in either configuration, when large diameter wafers are supported, it becomes possible to reduce the contact surface area between semiconductor wafers and the heat treatment jig, thereby enabling to prevent the generation of slips due to the close adhesion between the jig and wafers.

(4) In "a first heat treatment jig" as above, a plurality of protruded portions on the surface to contact with semiconductor wafers can be disposed, and can be arranged so as to be symmetric with respect to a center point.

In this regard, the top face of a plurality of said protruded portions is preferably configured to be a circular form with the diameter of no less than 5.0 mm but no greater than 30 mm.

(5) In "a first and second heat treatment jig" as above, the fixture material can be either of silicon, impregnated silicon carbide, silicon carbide, porous silicon carbide, quartz, graphite, or glassy carbon. Besides, a silicon carbide (SiC) coating with film thickness of no less than 10 μm but no greater than 150 μm can be applied on the above fixture material.

Otherwise, when SiC coating is not applied, the film composed of either porous Si, $Si_3N_4$ or $SiO_2$ can be deposited to be about 0.2 μm through 50 μm in thickness on the fixture material by vapor-phase epitaxy method and the like.

BEST MODE FOR CARRYING OUT THE INVENTION

The embodiments of a heat treatment jig, by the present invention, for semiconductor wafers that is brought into a vertical heat treatment furnace are recited in classifying into "a first heat treatment jig" and "a second heat treatment jig" with reference to drawings. Nevertheless, the feature of the present invention shall not be limited to the specific examples shown below.

1. A First Heat Treatment Jig

1-1. Feature of a First Heat Treatment Jig

A first heat treatment jig according to the present invention, characterized in that a diameter of a disk-type structure is no less than 60% of the diameter of semiconductor wafers to be loaded; a thickness thereof is no less than 1.0 mm but no greater than 10 mm; a surface roughness (Ra value) of the surface to contact with semiconductor wafers is no less than 0.1 μm but no greater than 100 μm; and a surface planarity thereof is no greater than 0.1 mm in concentric direction and no greater than 0.2 mm in diametrical direction.

Figure 2:
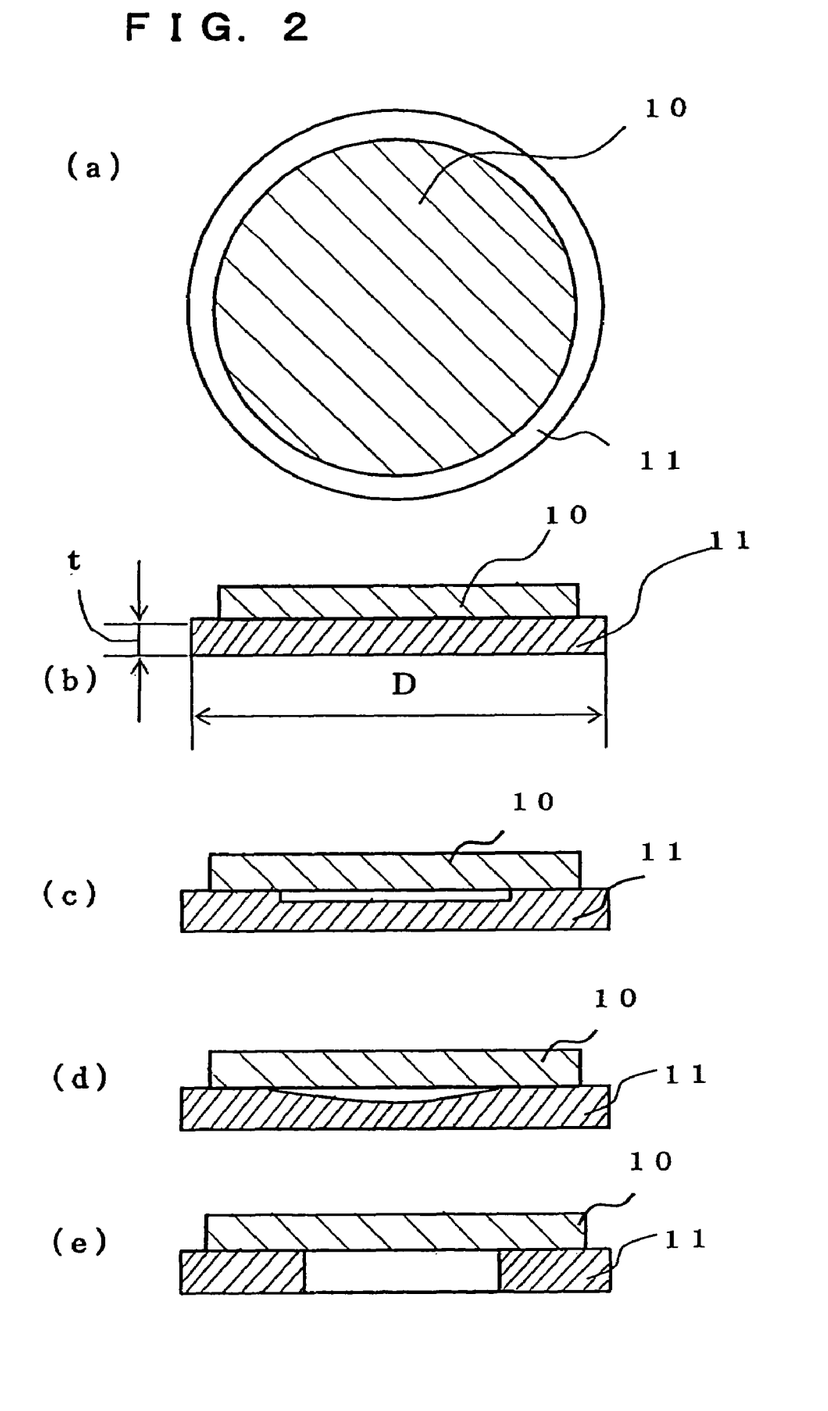
FIG. 2 is a diagram explaining a configuration example of a heat treatment jig according to the present invention, where (a) is a plan view, (b) is a front view in section, either (c) or (d) shows a front view in section for a heat treatment jig having recess beds with a conical figuration or those with a spherical figuration respectively, and (e) shows a front view in section for a heat treatment jig having a ring-type structure.
Figure 9:
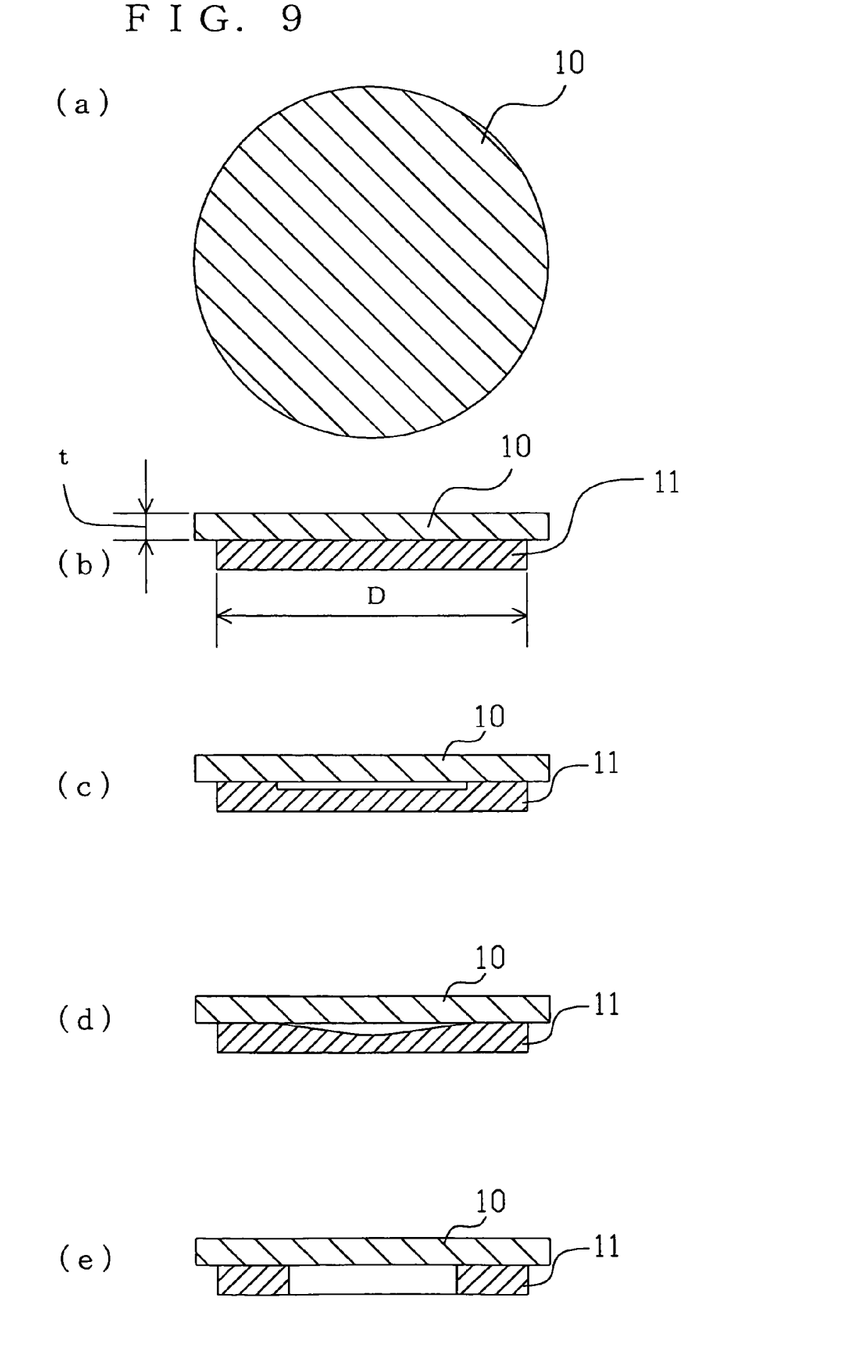
FIG. 9 is a diagram explaining a configuration example of a heat treatment jig according to the present invention, where (a) is a plan view, (b) is a front view in section, either (c) or (d) shows a front view in section for a heat treatment jig having recess beds with a conical figuration or those with a spherical figuration respectively, and (e) shows a front view in section for a heat treatment jig having a ring-type structure.

FIGS. 2 and 9 are diagrams explaining a configuration example of a heat treatment jig according to the present invention, where (a) is a plan view, (b) is a front view in section, either (c) or (d) shows a front view in section for a heat treatment jig having recess beds with a conical figuration or those with a spherical figuration respectively, and (e) shows a front view in section for a heat treatment jig having a ring-type structure.

In a configuration shown in FIG. 2, a heat treatment jig 11 to be loaded with wafers 10 has a disk-type structure with diameter D along with thickness t, wherein the diameter D is set to be larger than that of wafers 10. However, in a configuration shown in FIG. 9, the diameter of wafers 10 may be larger than the diameter D.

Further, in FIGS. 2(c) through (e), a sectional view of relevant configuration examples in the heat treatment jig 11 is shown, the configuration of which is featured by recess beds with a conical figuration at the central region of the heat treatment jig 11, recess beds with a spherical figuration at the central region of the heat treatment jig 11, and a ring-type structure of the heat treatment jig 11.

Figure 3:
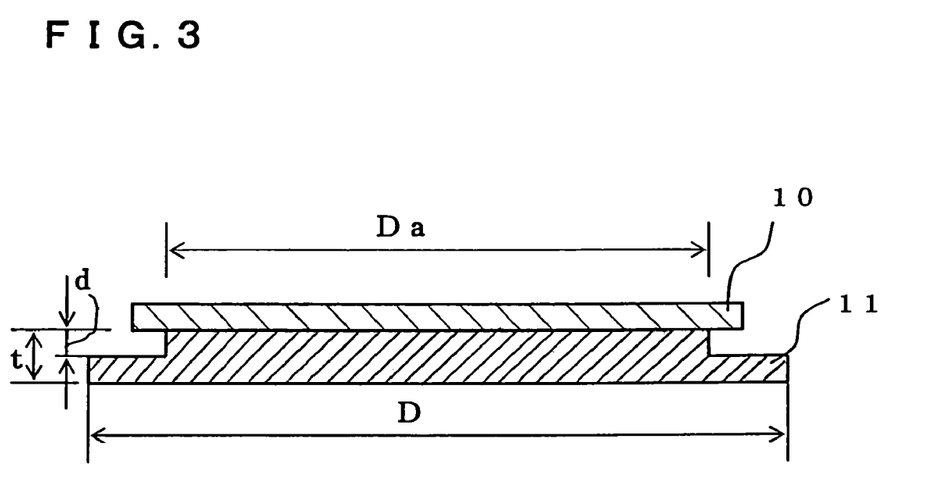
FIG. 3 is a diagram showing other configuration examples of a heat treatment jig according to the present invention.

FIG. 3 is a diagram showing other configuration examples of the heat treatment jig according to the present invention. In a configuration shown in FIG. 3, the heat treatment jig 11 to be loaded with wafers 10 has a disk-type structure with diameter D along with thickness t, wherein, given the diameter of the region thereof to contact with wafers 10 by Da, the diameter Da is set to be smaller than that of wafers 10.

This is for the reason that, in case of supporting semiconductor wafers with large diameter, as afore-mentioned, the surface area of the contact region between semiconductor wafers 10 and the heat treatment jig 11 can be reduced, thereby enabling the generation of slips due to the adhesion between the heat treatment jig and wafers to be prevented.

In a first heat treatment jig, the thickness t is set to be no less than 1.0 mm but no greater than 10 mm. Normally, by securing said thickness of the heat treatment jig, the planarity can be improved. Thus, by applying 1.0 mm or more in thickness, the deflection of the heat treatment jig and/or the strain during surface processing can be eliminated, thereby enabling the planarity to be improved.

Meanwhile, when the thickness should exceed 10 mm, the heat capacity of the heat treatment jig will increase, resulting in the deterioration of heat-up/cool-down characteristic and the decrease of the number of wafers to be loaded, thereby reducing the productivity. Therefore, the upper limit is set to be 10 mm. In commercial operation, since several tens of heat treatment jigs are brought into the heat treatment furnace, it is preferable that the thickness is set to be no less than 1.5 mm but no greater than 5.0 mm.

In a first heat treatment jig, the surface roughness of the region thereof to contact with semiconductor wafers is set to be no less than 0.1 μm but no greater than 100 μm. The surface roughness defined by the present invention is designated by the center-line average roughness (Ra value) in accordance with JIS B 0601.

When the surface roughness is less than 0.1 μm, the blasting method using silica beads or silicon carbide beads, or the method to imprint the tool-mark utilizing machining apparatus or turning lathe must be applied to make the surface rough to some extent, thereby finally enabling the specified surface roughness (Ra value) to be secured.

In case the blasting treatment is applied, the treatment intended to get coarser surface roughness (Ra value) should likely render damage to the heat treatment jig. Thus, the upper limit is set to be 100 μm.

On the other hand, in case the tool-mark is imprinted, the upper limit of the surface roughness (Ra value) can be up to ⅓ of the thickness of the heat treatment jig. However, in light of the possible exerted load onto the machining apparatus and/or the decrease of productivity, the upper limit is set to be 100 μm. According to the present invention, it is preferable that the upper limit of the surface roughness (Ra value) is set to be 50 μm, and more preferably to be set in the range of no less than 1 μm but no greater than 5 μm.

Moreover, in a first heat treatment jig, it is set forth that the planarity in the concentric direction is set to be no greater than 0.1 mm and the planarity in the diametrical direction is set to be no greater than 0.2 mm. The planarity defined by the present invention is designated by JIS B 0621.

Figure 4:
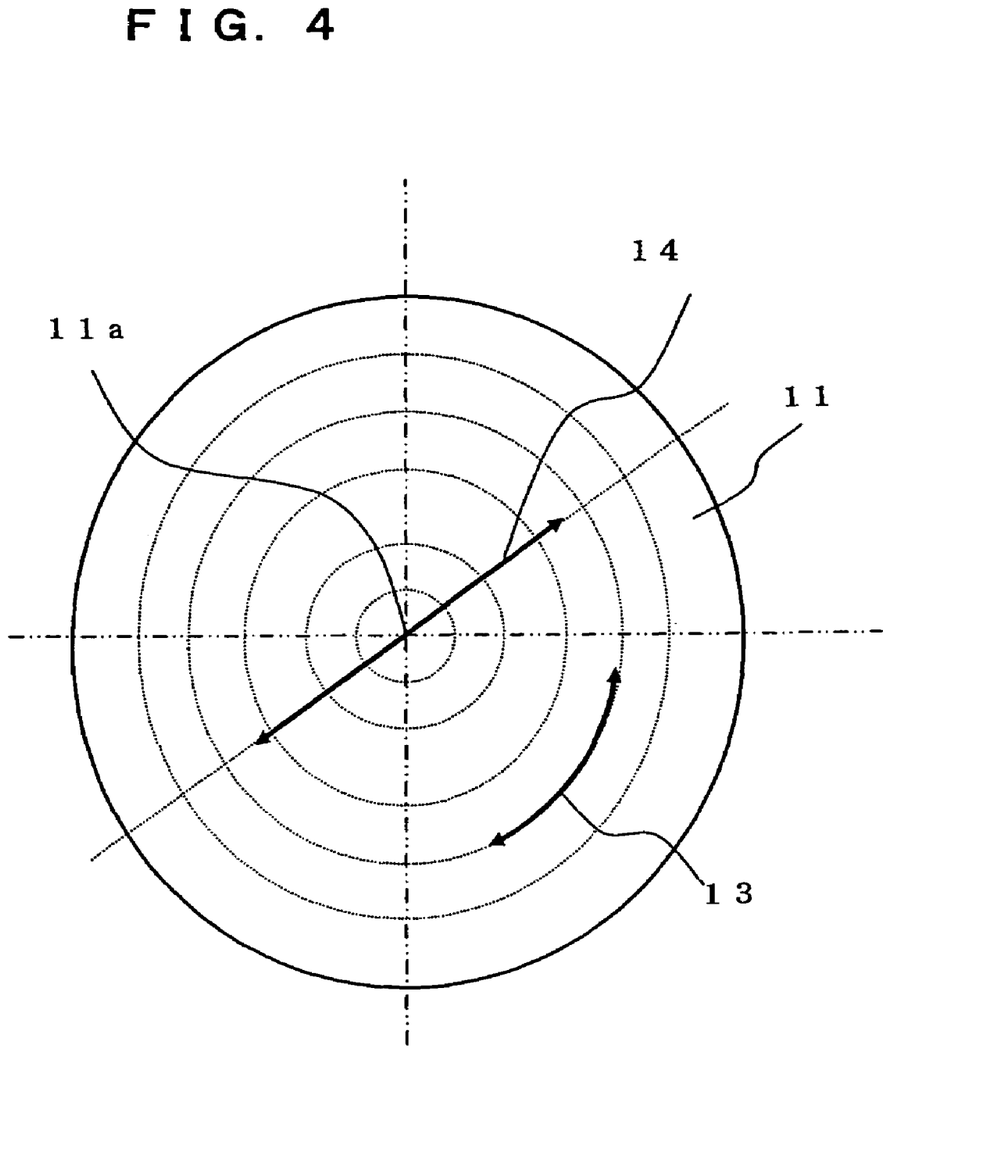
FIG. 4 is a diagram explaining the planarity in concentric direction as well as in the diametrical direction, which is defined by the present invention.

FIG. 4 is a diagram explaining the planarity in the concentric circle direction as well as in the diametrical direction, which is defined by the present invention. As shown in FIG. 4, the planarity in the concentric circle direction can be obtained by measurement at multiple locations in the concentric circle direction (arrow 13) with respect to the center 11a of the heat treatment jig 11. Also, the planarity in the diametrical direction can be obtained by measurement at multiple locations in the radial direction (arrow 14) off the center 11a.

When the planarity in the concentric circle direction should exceed 0.1 mm, the number of wafer-support positions within the concentric circle tends to be three (3), thereby sustaining the generation of slips very likely due to the concentrated load by the tare weight of the wafer at three wafer-support positions. Therefore, in order to secure multiple, more than three, supporting positions within the concentric circle, the planarity in the concentric circle direction is set to be no greater than 0.1 mm, preferably no greater than 0.05 mm.

In case of the heat treatment jig having protruded portions, the wafer-contact-support is carried out in the vicinity of the central region thereof, thus making it easy for slips to be generated at the contact positions. In this regard, to solve the above problem, it is preferable to provide with a ring-type structure or recess-type structure in the vicinity of the central region of the surface.

When the ring-type structure or the recess-type structure is provided, the diameter of the ring-type structure or the inside diameter of the recess beds in recess-type structure is preferably no less than 60% but no greater than 85% of the diameter of the wafer.

By incorporating the above configuration, the wafer can be supported at the region ranging from 60% to 85% of the diameter thereof, and the planarity in the concentric circle direction is no greater than 0.1 mm, thereby enabling multi-position support and the generation of slips to be reduced.

Meanwhile, the planarity in the diametrical direction of the heat treatment jig is set to be no greater than 0.2 mm. If the planarity in the diametrical direction should exceed 0.2 mm, a line contact should likely occur in the vicinity of the specific concentric circle, thereby generating slips very likely. According to the present invention, it is preferable that the planarity in the diametrical direction is set to be no greater than 0.1 mm.

In case of the configuration of the heat treatment jig other than those described as above and having no protruded portions, it is not necessary to provide with a ring-type structure or a recess-type structure, but adequate enough to provide the heat treatment jig with a plane-type structure at the region of no greater than 60% of the wafer diameter.

In other words, the heat treatment jig according to the present invention is characterized in that the structure has no elevated region with maximum height for the region of no greater than 60% of the wafer diameter, and the planarity for the region of no less than 60% of the wafer diameter is defined in such a way that the planarity in the concentric circle direction is set to be no greater than 0.1 mm, preferably no greater than 0.05 mm, and simultaneously the planarity in the diametrical direction is set to be no greater than 0.2 mm, preferably no greater than 0.1 mm. Thus, it becomes possible to effectively reduce the generation of slips.

In the heat treatment jig according to the present invention, it is better for the lower limit of the planarity to close in on zero (0). But in light of the machining accuracy and the manufacturing cost, there should be a limit in reality, and it is preferable that either lower limit is set to be 0.03 mm.

As afore-mentioned, the planarity either in the concentric circle direction or in the diametrical direction as shown in FIG. 4 can be obtained by measurement at multiple positions. In the measurement at multiple positions, the planarity in the concentric direction is measured, for instance, at the circumferential locations equally spaced with about 5 mm pitch for each concentric circle which is equally spaced with 5 mm radial pitch.

Meanwhile, the measurement in the diametrical direction, for instance, is carried out for every azimuthal angle determined by equally spacing the outer circumference of the heat treatment jig with 5 mm pitch (in case of wafers of 300 mm in diameter, the azimuthal angle will be 2 degree due to equally dividing by 180), at the positions on each circumference which is equally spaced with radial 5 mm pitch.

With regard to the planarity for a first heat treatment jig, for instance, in case silicon carbide material with about 300 mm diameter is used to manufacture the jig by disk cutting, the multi-position measurement by a planarity measurement apparatus shall be carried out (for instance, measurements for every 5 mm pitch). Based on the obtained data, further cutting-machining or polishing, otherwise local blasting treatment will be applied to finally adjust the planarity of the heat treatment jig.

In a first heat treatment jig, it is preferable that the contacting surface with semiconductor wafers has a ring-type structure and the diameter is smaller than that of semiconductor wafers. Thus, the contacting surface area with semiconductor wafers can be reduced, and the elimination of the central region can ensure the reduction of the contacting surface area remarkably.

Figure 5:
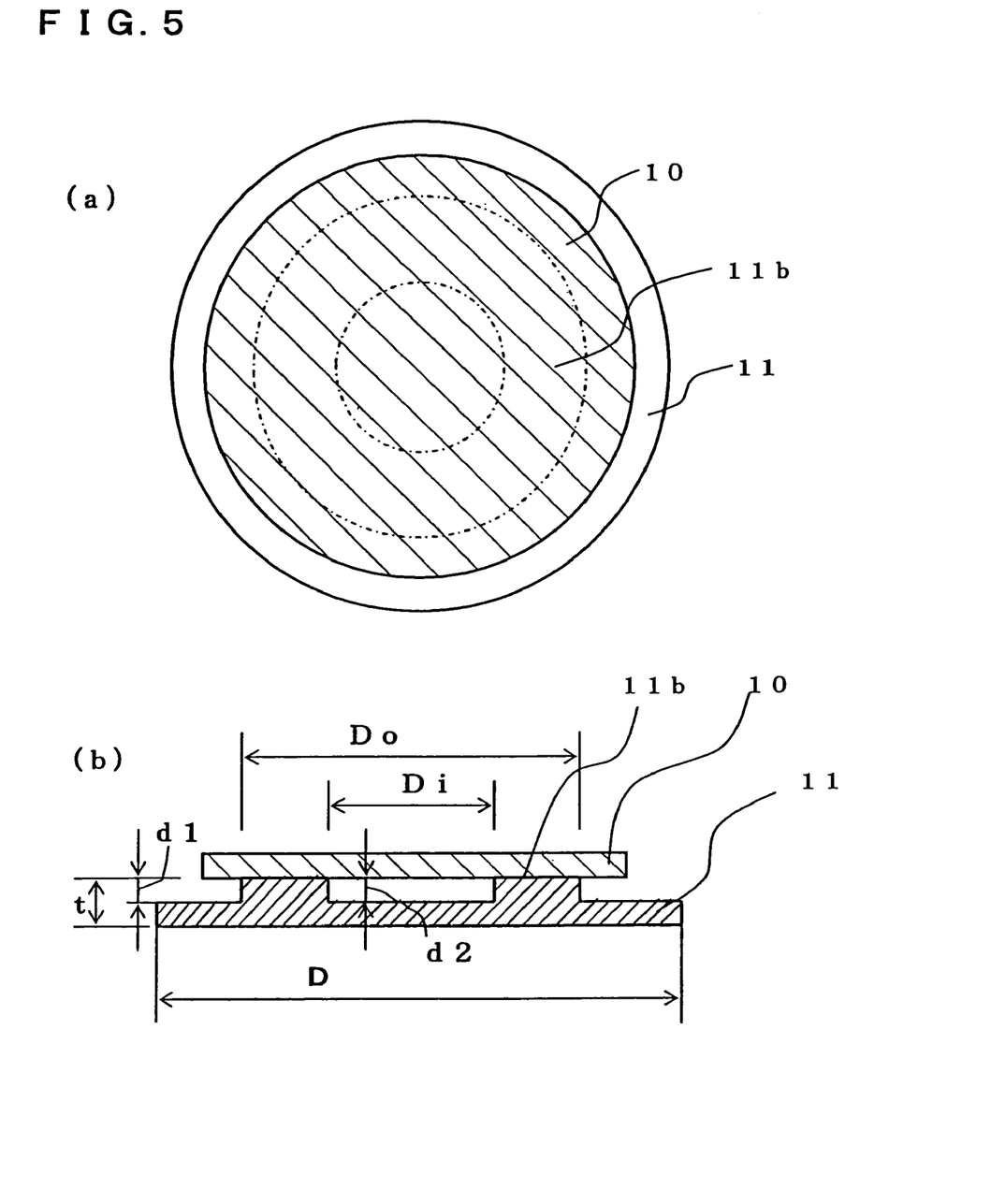
FIG. 5 is a diagram explaining a configuration of a heat treatment jig having the contact surface with semiconductor wafers in a ring-type structure according to the present invention, where (a) is a plan view and (b) is a front view in section.

FIG. 5 is a diagram explaining a configuration of a heat treatment jig having the surface contacting with semiconductor wafers in a ring-type structure according to the present invention, where (a) is a plan view and (b) is a front view in section. The heat treatment jig 11 to be loaded with wafers 10 has a disk-type shape with diameter D along with thickness t, wherein the contacting surface 11b with wafers 10 has a ring-type structure comprising the outside diameter Do and the inside diameter Di, and wherein the diameter Do is set to be smaller than that of wafers 10.

In forming a ring-type structure, although either the step d1 at the outer peripheral region or the step d2 at the inner peripheral region of the ring is not specifically defined, it is better to secure either one to the extent so as not to contact with wafers 10.

As shown in FIG. 5, by forming a ring-type structure, the area of the surface 11b contacting with wafers 10 can be further reduced compared with the configuration example shown in above FIG. 3, thereby enabling to prevent the generation of slips due to the adhesion between semiconductor wafers and the heat treatment jig.

In a first heat treatment jig, a plurality of protruded portions can be disposed onto the contacting surface with semiconductor wafers, and can be arranged so as to be symmetric with respect to a center point. Thus, the impartial reduction of contacting surface area can be achieved, thereby enabling to prevent the generation of slips due to the close adhesion. In this regard, the top face of a plurality of said protruded portions is preferably configured to be a circular form with the diameter of no less than 5.0 mm but no greater than 30 mm. This is for the reason that the much more impartial reduction of contacting surface area can be expected.

Figure 6:
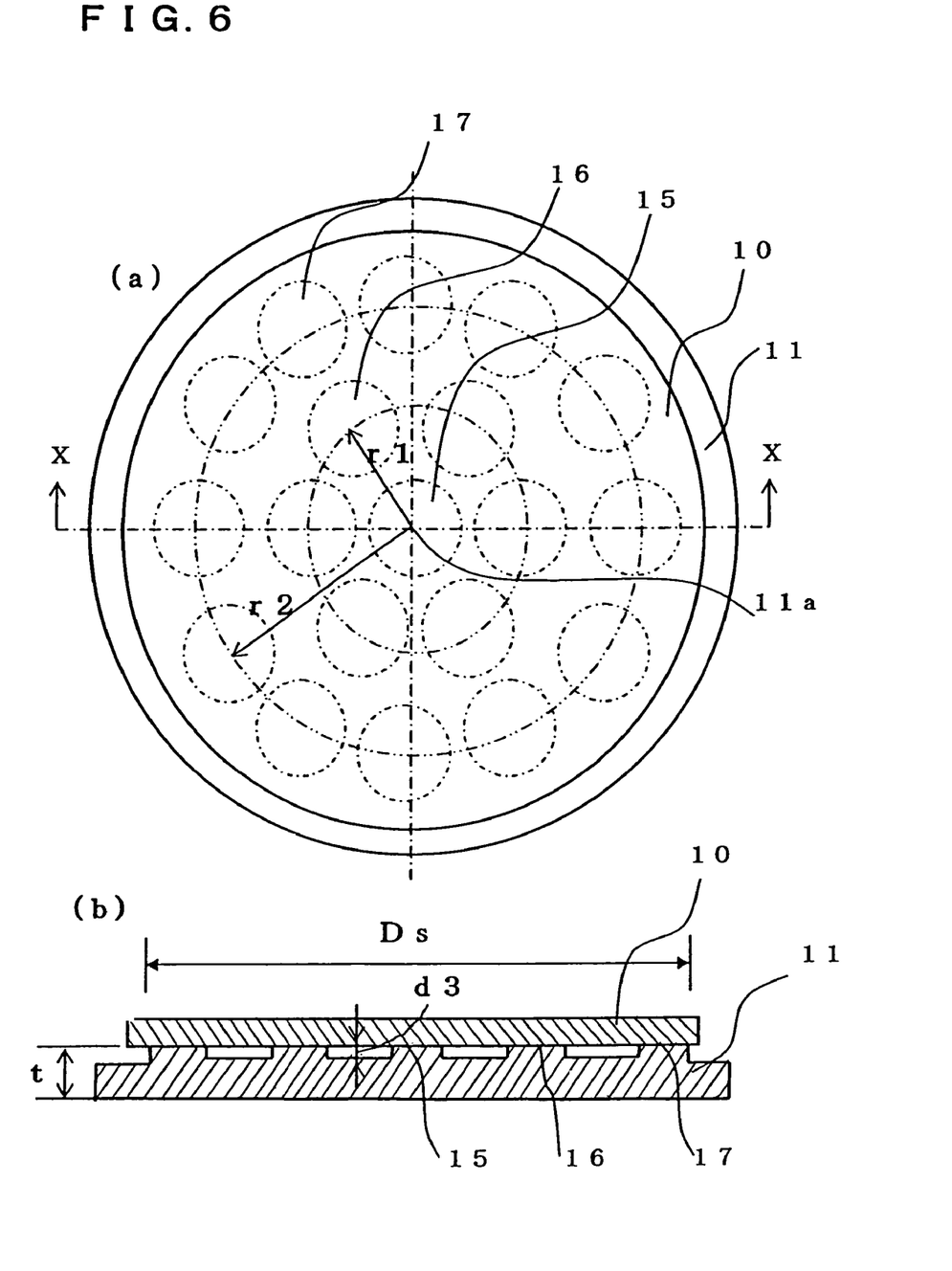
FIG. 6 is a diagram explaining a configuration of a heat treatment jig having a plurality of protruded portions according to the present invention, where (a) is a plan view of said heat treatment jig and (b) is a front view in section seen from X-X direction of that loaded with semiconductor wafers.

FIG. 6 is a diagram explaining a configuration example of a heat treatment jig having a plurality of protruded portions according to the present invention, where (a) is a plan view of said heat treatment jig and (b) is a front view in section seen from X-X direction of that loaded with semiconductor wafers. In the configuration shown in FIG. 6, the protruded portions 15 disposed in the center, six protruded portions 16 disposed at the circumference with a radius of r1, and twelve protruded portions 17 disposed at the circumference with a radius of r2 are provided.

The arrangement of these protruded portions 15, 16, 17 is made to be symmetric with respect to a center point 11a of the heat treatment jig 11. Furthermore, the diameter Ds of the outermost circumscribing circle of the protruded portions 17 is preferably set to be smaller than the diameter of the wafer.

The arrangement of protruded portions is not specifically limited to the one shown in FIG. 6, but other arrangement is also allowed. For instance, the arrangement can be made in such a way that the diameter of the protruded portions from the center point of the jig is enlarged accordingly or the protruded portions with small diameter are disposed in-between the protruded portions with large diameter.

The feature of the protruded portions is not specifically limited to the dimple shape shown in FIG. 6(a), but the protruded portions having a mesh figuration such as the grid formation, not shown in the diagram, can be applied. When the protruded portions are formed in the heat treatment jig, the blast treatment can be applied while posting a protective seal or groove cutting by the cutting chip can be applied as shown in following FIG. 7.

Figure 7:
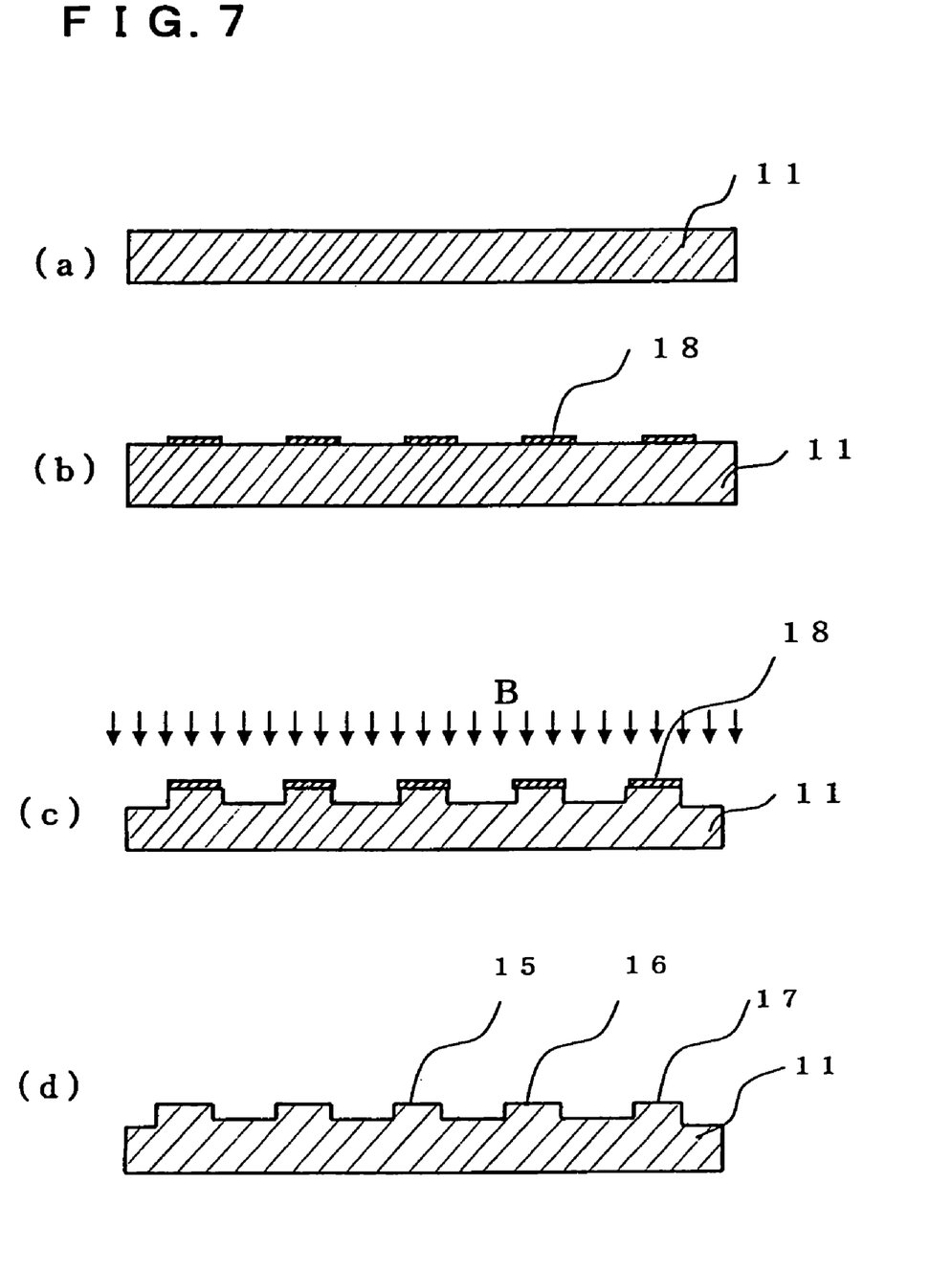
FIG. 7 is a diagram explaining the procedure how the protruded portions are disposed onto the contact surface of heat treatment jig, where (a) through (d) delineate the procedure.

FIG. 7 is a diagram explaining the procedure how the protruded portions are provided onto the surface of the heat treatment jig, where (a) through (d) delineate the procedure. Above (a) and (b) show that, on the surface of the heat treatment jig 11 having protruded portions formed, a protective seal 18 having exactly the same shape with that of protruded portions is posted. Then, as shown in above (c), the blast treatment B scrapes off the area where the protective seal 18 is not posted, thus enabling to produce the heat treatment jig 11 having protruded portions 15, 16, 17 formed as shown in above (d).

In the first heat treatment jig, for its fixture material, either silicon carbide impregnated with silicon, silicon carbide, porous silicon carbide, quartz, silicon graphite or glassy carbon can be used.

Especially, silicon, graphite and glassy carbon have equivalent or softer hardness compared to silicon in the contact region with silicon wafers, thereby enabling the generation of slips to be further reduced.

Further, it is preferable to apply silicon carbide (SiC) coating of no less than 10 µm but no greater than 150 µm in film thickness onto the fixture material. By coating a high-purity SiC, the wafer contamination can be reduced. Also, in case the heat treatment jig made of graphite or glassy carbon is used, it can be applied for oxidizing atmosphere heat treatment when SiC coating is provided on it.

Meanwhile, in place of SiC coating, the deposition of porous crystal Si film or $Si_3N_4$ film, or $SiO_2$ film where either having the thickness of about 0.2 µm through 50 µm can be also sufficiently effective.

1-2. EXAMPLES

Various jigs in category of a first heat treatment jig, with the variance of the jig configuration, thickness t, surface roughness (Ra value), planarity and the like, are made, installed into the wafer supporting section in the vertical heat treatment furnace where 4-outer-peripheral-point support is intended, and loaded with silicon wafers of 300 mm in diameter.

The heat treatment condition comprises the steps of heating from room temperature up to 1300° C. in 1% oxygen gas atmosphere, holding at 1300° C. for 2 hours subsequently, and cooling down to room temperature. After the heat treatment, silicon wafers are observed by a X-ray analysis apparatus for the presence/absence of slip generation.

Example 1

In Example 1, the heat treatment jig having a plurality of protruded portions formed as shown in above FIG. 6 is made. To that end, as shown in above FIG. 7, silicon is used for substrate member and the jig is processed to have a disk-type structure comprising 304 mm diameter, 2.5 mm thickness, 0.04 mm planarity in the concentric direction and 0.04 mm planarity in the diametrical direction (step (a)).

On the disk thus obtained, the masking treatment with circular protective seals 18 of 8.0 mm in diameter is carried out at every 1.0 mm pitch (step (b)), the blast treatment B is applied to scrape off the disk surface by an amount of 50 µm (step (c)), and then the circular protective seals 18 are ripped off to finally reveal protruded portions 15, 16, 17 (step (d)).

In addition, by applying a benign blast treatment onto the whole surface of the disk-type jig 11 thus obtained, the heat treatment jig with surface roughness (Ra value) of 1.5 µm is completed.

By using the heat treatment jig thus made, silicon wafers are heat treated under the above heat treatment condition and observed for slip generation, whereby no slip is generated.

Example 2

In Example 2, SiC coating is applied. Silicon is used for the substrate material and the jig is processed to have a disk-type figuration comprising 304 mm diameter, 2.0 mm thickness, 0.02 mm planarity in the concentric direction and 0.06 mm in the diametrical direction. Next, by applying the blast treatment, the surface roughness (Ra value) of 2.5 µm is secured, SiC coating is subsequently applied for 20 µm deposition in conversion, and a light polishing is provided in succession in order to remove the region of abnormal growth by SiC, followed by the blast treatment to obtain the heat treatment jig with final surface roughness (Ra value) of 1.9 µm.

The heat treatment jig thus made is used for heat treatment under above condition and silicon wafers are observed for slip generation, whereby no slip is generated.

Example 3

In Example 3, silicon carbide is used for the substrate material and the jig is processed to have a disk-type figuration comprising 304 mm diameter, 2.0 mm thickness, 0.08 mm planarity in the concentric direction and 0.19 mm in the diametrical direction, followed by the blast treatment for obtaining the surface roughness (Ra value) of 1.0 µm.

The heat treatment jig thus made is used for heat treatment under above condition and silicon wafers are observed for slip generation, whereby several slips of about 20-30 mm are generated.

Example 4

In Example 4, the heat treatment jigs with the variance of surface roughness (Ra value) are used. Silicon is used for the substrate material and the jig is processed to have a disk-type structure, as shown in FIG. 5, comprising 304 mm of diameter D, 230 mm of diameter $D_0$, 200 mm of inside diameter, 0.05 mm planarity in the concentric direction with respect to the face 11b and 0.06 mm planarity in the diametrical direction with respect to the same face, followed by a mirror-finish polishing and a subsequent blast treatment.

The heat treatment jigs are made to have the disk with four levels of surface roughness (Ra value) as being 0.02 µm (as mirror-finish polishing), 0.1 µm, 1.3 µm and 4.7 µm (blast treatment after mirror-finish polishing) respectively.

The heat treatment jigs thus made are used for heat treatments under above condition and silicon wafers are observed for slip generation. In case the heat treatment jig with 0.02 µm surface roughness (Ra value) is used, a lot of slips are generated due to the close adhesion between the heat treatment jig and silicon wafers.

On the other hand, in case the heat treatment jig with 0.1 µm surface roughness (Ra value) is used, a few but benign slips are generated due to the minute traces of adhesion between the heat treatment jig and silicon wafers, however, no slip is generated in case that the heat treatment jigs with 1.3 µm and 4.71 µm surface roughness (Ra value) are used.

Comparative Example 1

In Comparative example 1, a thin wall heat treatment jig is used. Silicon carbide is used for the substrate material and the jig is processed to comprise 304 mm diameter, 0.75 mm thickness, 0.08 mm planarity in the concentric direction, 0.19 mm planarity in the diametrical direction and 1.0 µm surface roughness (Ra value).

The heat treatment jig thus made is used for heat treatment under above condition and silicon wafers are observed for slip generation, whereby a lot of slips are generated, that are attributable to the deformation of the heat treatment jig due to its thin wall thickness, which is caused by the tare weight of silicon wafers.

2. A Second Heat Treatment Jig 2-1. Feature of a Second Heat Treatment Jig

A second heat treatment jig according to the present invention, characterized in that a diameter of a disk-type structure is no less than 60% of the diameter of semiconductor wafers to be loaded; a thickness thereof is no less than 1.0 mm but no greater than 10 mm; and a surface roughness (Ra value) of the surface to contact with semiconductor wafers is no less than 0.05 µm but no greater than 100 µm, wherein a contacting surface with said semiconductor wafers is divided into multiple regions and the maximum height is measured for each region, and wherein a difference between said maximum height and the hypothetical-average-height-plane obtained through above measurement being no greater than 50 µm.

In a second heat treatment jig, wafers to be loaded have large diameter of 300 mm, and the diameter of the disk- or the ring-type structure is no less than 60% of that of semiconductor wafers and a thickness thereof is no less than 1.0 mm but no greater than 10 mm as like as a first heat treatment jig, while, in order to obtain better apparent planarity as described later, the surface roughness (Ra value) is specified to be no less than 0.05 µm but no greater than 100 µm and furthermore the concept of hypothetical average roughness surface is set forth in place of the planarity feature.

In a first heat treatment jig as above, in order to load large diameter wafers of 300 mm, the surface planarity is specified. However, in order to secure the specified planarity, an ultra high precision machining becomes necessary, thus resulting in the increase of the production cost, which becomes an issue.

In general, surface waviness consisting of concave/convex is locally present on the heat treatment jig surface to contact with semiconductor wafers, thus ending up in supporting wafers at the maximum height position. Accordingly, in a second heat treatment jig, the planarity is limited to a predetermined level, and it is set forth that the maximum height in each division is to be measured.

Namely, in a second heat treatment jig, for instance, the jig is processed to have a predetermined planarity and the surface is divided into divisions being 5 mm square in each, and the measuring probe is scanned for each division to carry out flatness measurement at multiple positions. Hence, the maximum height in each division is measured and the hypothetical-average-height-plane is set from the flatness measurement readings thus obtained.

Subsequently, in order to control the difference in each division between the maximum height of the surface waviness and the hypothetical-average-height-plane to be no greater than 50 µm, the division where the difference exceeds 50 µm is subjected to, for instance, blast treatment for scraping off the outstanding locations in concern, whereby improving the apparent planarity, that is, reducing the difference between the maximum height in relevant division measured at multiple positions and the hypothetical-average-height-plane obtained through the measurements.

Thus, by improving the apparent planarity, the number of contacting points within the surface area where to support wafers can be increased, whereby the load imposed by the tare weight of wafers can be scattered.

Figure 8:
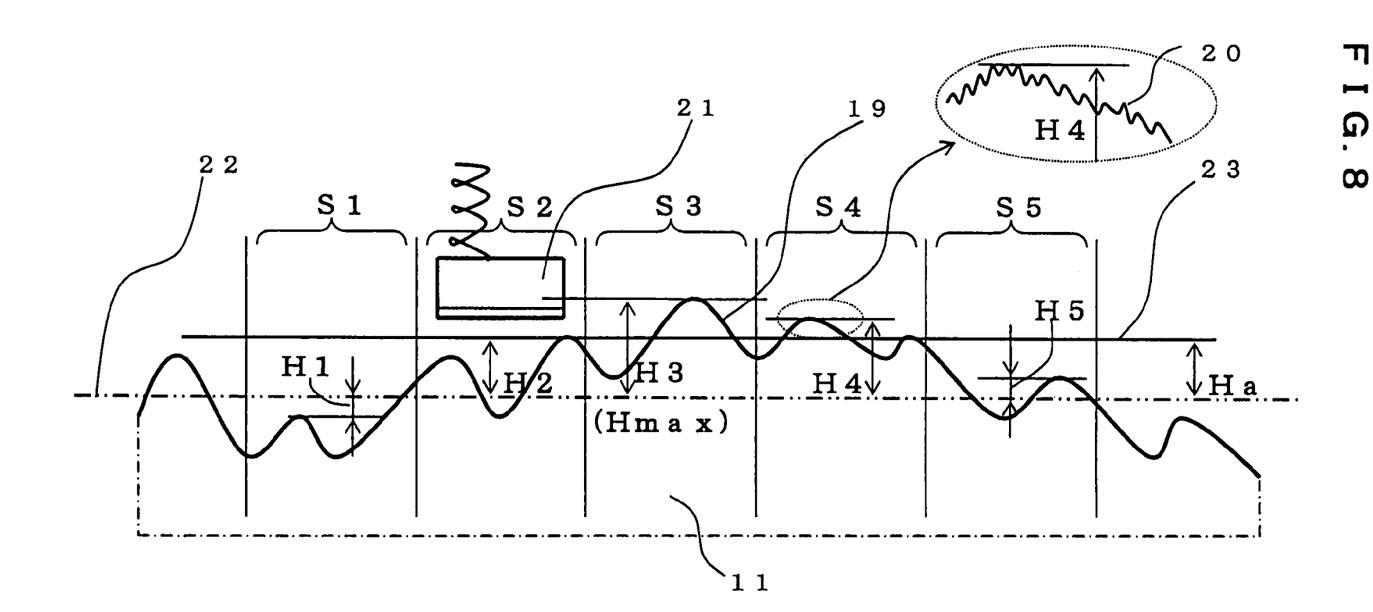
FIG. 8 is a diagram explaining the method how the difference between the maximum height at each region and the hypothetical-average-height-plane obtained in flatness measurement to be performed at multiple positions, which is defined in a second heat treatment jig according to the present invention, is controlled.

FIG. 8 is a diagram explaining the method how the difference between the maximum height at each division and the hypothetical-average-height-plane obtained in flatness measurement to be performed at multiple positions, which is defined in a second heat treatment jig according to the present invention, is controlled. As shown in the diagram, surface waviness 19 is formed on the entire surface of the heat treatment jig 11, wherein, when part of the surface is microscopically observed, a surface waveform 20 designating the surface roughness can be seen.

The apparent planarity in a second heat treatment jig is maintained so that, for instance, the planarity of the heat treatment jig 11 is to be 0.2 mm (200 µm), and its surface is divided into a number of N divisions being spaced with 5 mm pitch, wherein the flatness measurement at multiple positions is performed.

To be concrete, each division (designated by S1-S5 in FIG. 8) is scanned by a probe 21 to measure the maximum height and to set the hypothetical-average-height-plane 22 by the obtained flatness measurement data.

Next, the difference (designated by H1-H5 in FIG. 8) in each division between the maximum height and the hypothetical-average-height-plane 22 is controlled in such a way that the apparent plane delineated by plotting said difference comes to be no greater than the standard plane 23, where delineated by 50 µm difference as of a standard criteria Ha. Thus, the apparent planarity can be markedly improved compared to the planarity of 200 µm at the initial processing stage.

The division (designated by S3 and S4 in FIG. 8) where the difference between the maximum height and the hypothetical-average-height-plane exceeds 50 µm (standard criteria Ha), is obliged to undergo the blast treatment for controlling the maximum height to be 50 µm or less.

As shown above, by controlling the difference between the maximum height at the surface contacting with semiconductor wafers and the hypothetical-average-height-plane, it becomes possible to increase the number of contacting locations in the surface area where wafers to be supported, whereby the load imposed by the tare weight of wafers can be scattered.

Besides, in a second heat treatment jig, the difference between the maximum height and the hypothetical-average-height-plane is controlled, for the reason that the low-lying division below the hypothetical-average-height-plane is intrinsically, very unlikely to contact with wafers, thus resulting in control-free category.

In addition, the divisions where the blast treatment and the like are applied to scrape off the outstanding locations are limited to those divisions where the difference between the maximum height and the hypothetical-average-height-plane exceeds the standard criteria, whereby much more accurate finishing can be attained.

As described above, in a second heat treatment jig, among the difference readings between the maximum height and the hypothetical-average-height-plane, the maximal maximum height Hmax (designated by S3 in FIG. 8) across whole divisions is regarded as an apparent planarity to be controlled, wherein the standard criteria thereof is set to be 50 µm.

In a second heat treatment jig, as shown in the previous FIG. 5, it is preferable that the surface contacting with semiconductor wafers is configured to be a ring-type structure and to have the diameter thereof being smaller than that of semiconductor wafers. By virtue of above, the surface area contacting with semiconductor wafers can be reduced, and in addition, the central portion is eliminated so as to further reduce the surface area, thus enabling the planarity to be readily controlled.

Besides, in a second heat treatment jig, either silicon-impregnated silicon carbide, silicon carbide, porous silicon carbide, quartz, silicon, graphite, or glassy carbon can be used as the fixture material.

Also, as described above for the fixture material in a first heat treatment jig, it is effective too to apply SiC coating of no less than 10 µm but no greater than 150 µm in film thickness onto the fixture material, otherwise it is effective to, in place of SiC coating, apply deposition of porous crystal Si film or $Si_3N_4$ film, or $SiO_2$ film where either having the thickness of about 0.2 µm through 50 µm.

2-2. EXAMPLES

Various jigs in category of a second heat treatment jig, with the variance of the jig configuration, thickness t, surface roughness (Ra value), planarity and the like, are made, installed into the wafer supporting section in the vertical heat treatment furnace where 4-outer-peripheral-point support is intended, and loaded with silicon wafers of 300 mm in diameter.

The heat treatment condition comprises the steps of heating from room temperature up to 1300° C. in 1% oxygen gas atmosphere, holding at 1300° C. for 2 hours subsequently, and cooling down to room temperature. After the heat treatment, silicon wafers are observed by a X-ray analysis apparatus for the presence/absence of slip generation.

Example 5

In Example 5, the heat treatment jig as shown in FIG. 3 above is made. Accordingly, the jig comprises 319 mm in diameter D, 2.0 mm in thickness t, 285 mm in diameter Da at the portion where to contact with wafers, and sintered silicon carbide for the fixture material.

Then, the contacting surface is divided into divisions being 5 mm square in each, where the maximum height in each division is obtained by planarity measurement at multiple positions, and the relevant divisions where the difference between the maximum height and the hypothetical-average-height-plane thus obtained exceeds 50 µm are subjected to the blast treatment for scraping off the outstanding locations, whereby the apparent planarity can be controlled to be no greater than 50 µm. Further, the blast treatment is carried out to achieve surface roughness (Ra value) of 1.4 µm.

By using the heat treatment jig thus prepared, silicon wafers are heat treated under the above heat treatment condition and observed for slip generation, whereby slight slips are generated at the peripheral region of the wafer contact surface but no slip is observed in other region.

Example 6

In Example 6, the heat treatment jig made of silicon for the fixture material as shown in FIG. 3 above is made. Accordingly, the jig comprises 319 mm in diameter D, 2.0 mm in thickness t, 285 mm in diameter Da at the portion where to contact with wafers, and silicon for the fixture material.

Then, under the same condition to Example 5, the maximum height in each division is obtained by planarity measurement at multiple positions, finally, whereby the apparent planarity can be controlled to be no greater than 50 µm. Further, the blast treatment is carried out to achieve surface roughness (Ra value) of 1.4 µm.

By using the heat treatment jig thus prepared, silicon wafers are heat treated under the above heat treatment condition and observed for slip generation, whereby no slip is generated.

Example 7

In Example 7, SiC coating is applied for the heat treatment jig made of silicon for the fixture material as shown in FIG. 3 above. Accordingly, the jig comprises 319 mm in diameter D, 2.0 mm in thickness t, 285 mm in outside diameter Da at the portion where to contact with wafers, and silicon for the fixture material.

Then, under the same condition to Example 5, the maximum height in each division is obtained by planarity measurement at multiple positions, and the relevant divisions where the difference between the maximum height and the hypothetical-average-height-plane thus obtained is no greater than 50 µm are subjected to the blast treatment on the outstanding locations, whereby the apparent planarity can be controlled to be no greater than 50 µm. Further, blast treatment is carried out to achieve surface roughness (Ra value) of 1.4 µm.

Afterwards, SiC coating is applied for 20 µm deposition in conversion, and a light polishing is provided in succession in order to remove the surface anomaly protrusions, followed by the blast treatment onto both surface to remove an amount of about 10 µm from SiC coating film, whereby surface roughness (Ra value) of 1.5 µm is secured.

By using the heat treatment jig thus prepared, silicon wafers are heat treated under the above heat treatment condition and observed for slip generation, whereby a piece of minute slip is merely generated.

Example 8

In Example 8, SiC coating is applied for the heat treatment jig made of silicon for the fixture material as shown in FIG. 5 above. Accordingly, the jig comprises 319 mm in diameter D, 4.0 mm in thickness t, 230 mm in outside diameter Do along with 180 mm in inside diameter Di at the portion where to contact with wafers, and glassy carbon for the fixture material.

Then, under the same condition to Example 5, the maximum height in each division is obtained by planarity measurement at multiple positions, and the relevant divisions where the difference between the maximum height and the hypothetical-average-height-plane thus obtained exceeds 50 µm are subjected to the blast treatment for scraping off the outstanding locations, whereby the apparent planarity can be controlled to be no greater than 50 µm. Further, polishing is carried out onto the surface subjected to the blast treatment so as to achieve surface roughness (Ra value) of 1.2 µm.

Afterwards, SiC coating is applied for 50 µm deposition, and the blast treatment is provided to polish off an amount of about 10 µm in SiC coating region, whereby surface roughness (Ra value) of 0.9 µm is secured.

By using the heat treatment jig thus prepared, silicon wafers are heat treated under the above heat treatment condition and observed for slip generation, whereby no slip is generated.

Comparative Example 2

In Comparative example 2, the heat treatment jig configured with a thin wall, as shown in FIG. 2 above, is applied. Accordingly, the heat treatment jig comprises 319 mm in diameter D, 0.85 mm in thickness t, and silicon carbide for the fixture material.

Then, under the same condition to Example 5, the maximum height in each division is obtained by planarity measurement at multiple positions, and the relevant divisions where the difference between the maximum height and the hypothetical-average-height-plane thus obtained exceeds 50 µm are subjected to the blast treatment for scraping off the outstanding locations, whereby the apparent planarity can be controlled to be no greater than 50 µm. Further, polishing is carried out onto the surface subjected to the blast treatment so as to achieve surface roughness (Ra value) of 1.5 µm.

By using the heat treatment jig thus prepared, silicon wafers are heat treated under the above heat treatment condition and observed for slip generation, whereby a lot of slips are generated at the outer peripheral surface of wafers.

INDUSTRIAL APPLICABILITY

A heat treatment jig according to the present invention comprising: a diameter of a disk-type structure being no less than 60% of the diameter of semiconductor wafers to be loaded; a thickness thereof being no less than 1.0 mm but no greater than 10 mm; surface roughness (Ra value) of no less than 0.1 µm but no greater than 100 µm at a contacting surface with said semiconductor wafers; and surface planarity thereof being specifically controlled in the concentric direction as well as in the diametrical direction, otherwise in place of above planarity, comprising a controlled maximum height in such a way that the maximum height is obtained by the flatness measurement at the multiple positions and the difference between said maximum height and the hypothetical-average-height-plane thus attained is no greater than 50 µm, can reduce the slip generation due to the close adhesion of semiconductor wafers and the heat treatment jig. Owing to the above feature, even if semiconductor wafers having large tare weight should be heat-treated, the slip generation can be effectively prevented, thus enabling the jig to be widely used as the reliable heat treatment jig for semiconductor substrates.

The invention claimed is:

1. A heat treatment jig for semiconductor wafers composed of a disk-type structure to be used for heat treatment by loading semiconductor wafers onto the upper surface thereof, said jig comprising:
   a diameter of said disk-type structure being no less than 60% of the diameter of semiconductor wafers to be treated;
   a thickness thereof being no less than 1.0 mm but no greater than 10 mm;
   a surface roughness (Ra value) of the surface to contact with said semiconductor wafers being no less than 0.1 µm but no greater than 100 µm; and
   a surface planarity thereof being no greater than 0.1 mm in the concentric direction and no greater than 0.2 mm in the diametrical direction.

2. A heat treatment jig for semiconductor wafers according to claim 1, comprising a diameter of the surface area, where to contact with said semiconductor wafers, being no less than 60% of the diameter of said semiconductor wafers.

3. A heat treatment jig for semiconductor wafers according to claim 2, comprising a plurality of protruded portions which are arranged symmetric with respect to a center point onto the surface area where to contact with said semiconductor wafers.

4. A heat treatment jig for semiconductor wafers according to claim 2, wherein the fixture material thereof is made of either silicon-impregnated silicon carbide, silicon carbide, porous silicon carbide, quartz, silicon, graphite, or glassy carbon.

5. A heat treatment jig for semiconductor wafers according to claim 1, comprising a ring-type structure for the surface area where to contact with said semiconductor wafers, wherein the diameter thereof is no less than 60% of the diameter of said semiconductor wafers.

6. A heat treatment jig for semiconductor wafers according to claim 5, comprising a plurality of protruded portions which are arranged symmetric with respect to a center point onto the surface area where to contact with said semiconductor wafers.

7. A heat treatment jig for semiconductor wafers according to claim 5, wherein the fixture material thereof is made of either silicon-impregnated silicon carbide, silicon carbide, porous silicon carbide, quartz, silicon, graphite, or glassy carbon.

8. A heat treatment jig for semiconductor wafers according to claim 1, comprising a plurality of protruded portions which are arranged symmetric with respect to a center point onto the surface area where to contact with said semiconductor wafers.

9. A heat treatment jig for semiconductor wafers according to claim 8, wherein the top face of a plurality of said protruded portions is configured to be a circular form with the diameter of no less than 5.0 mm but no greater than 30 mm.

10. A heat treatment jig for semiconductor wafers according to claim 8, wherein the fixture material thereof is made of either silicon-impregnated silicon carbide, silicon carbide, porous silicon carbide, quartz, silicon, graphite, or glassy carbon.

11. A heat treatment jig for semiconductor wafers according to claim 1, wherein fixture material of the heat treatment jig is made of either silicon-impregnated silicon carbide, silicon carbide, porous silicon carbide, quartz, silicon, graphite, or glassy carbon.

12. A heat treatment jig for semiconductor wafers according to claim 11, wherein silicon carbide (SiC) coating with film thickness of no less than 10 μm but no greater than 150 μm is further applied.

13. A heat treatment jig for semiconductor wafers composed of a disk-type structure to be used for heat treatment by loading semiconductor wafers onto the upper surface thereof, said jig comprising:

a diameter of said disk-type structure being no less than 60% of the diameter of said semiconductor wafers;

a thickness thereof being no less than 1.0 mm but no greater than 10 mm; and a surface roughness (Ra value) of the surface area to contact with said semiconductor wafers being no less than 0.05 μm but no greater than 100 μm, wherein the surface area to contact with said semiconductor wafers is divided into several divisions and the maximum height is measured for each division, and wherein the difference between said maximum height and the hypothetical-average-height-plane obtained through above measurement is controlled to be no greater than 50 μm.

14. A heat treatment jig for semiconductor wafers according to claim 13, comprising a diameter of the surface area, where to contact with said semiconductor wafers, being no less than 60% of the diameter of said semiconductor wafers.

15. A heat treatment jig for semiconductor wafers according to claim 14, wherein the fixture material thereof is made of either silicon-impregnated silicon carbide, silicon carbide, porous silicon carbide, quartz, silicon, graphite, or glassy carbon.

16. A heat treatment jig for semiconductor wafers according to claim 13, comprising a ring-type structure for the surface area where to contact with said semiconductor wafers, wherein the diameter thereof is no less than 60% of the diameter of said semiconductor wafers.

17. A heat treatment jig for semiconductor wafers according to claim 16, wherein the fixture material thereof is made of either silicon-impregnated silicon carbide, silicon carbide, porous silicon carbide, quartz, silicon, graphite, or glassy carbon.

18. A heat treatment jig for semiconductor wafers according to claim 13, wherein the fixture material thereof is made of either silicon-impregnated silicon carbide, silicon carbide, porous silicon carbide, quartz, silicon, graphite, or glassy carbon.

19. A heat treatment jig for semiconductor wafers according to claim 18, wherein silicon carbide (SiC) coating with film thickness of no less than 10 μm but no greater than 150 μm is further applied.

* * * * *